United States Patent
Donati et al.

(10) Patent No.: US 7,542,682 B2
(45) Date of Patent: Jun. 2, 2009

(54) MILLIMETER WAVE TRANSMITTER USING OPTICAL HETERODYNING

(75) Inventors: Silvano Donati, Pavia (IT); Tiziana Tambosso, Turin (IT)

(73) Assignee: Telecom Italia S.p.A., Milan (IT)

( * ) Notice: Subject to any disclaimer, the term of this patent is extended or adjusted under 35 U.S.C. 154(b) by 432 days.

(21) Appl. No.: 10/519,771

(22) PCT Filed: Jun. 21, 2002

(86) PCT No.: PCT/IT02/00414

§ 371 (c)(1),
(2), (4) Date: Dec. 17, 2004

(87) PCT Pub. No.: WO04/001955

PCT Pub. Date: Dec. 31, 2003

(65) Prior Publication Data

US 2005/0259908 A1    Nov. 24, 2005

(51) Int. Cl.
*H04B 10/12* (2006.01)
*H04B 10/06* (2006.01)

(52) U.S. Cl. .................. 398/141; 398/153; 398/182; 398/202; 398/204

(58) Field of Classification Search ............ 398/115, 398/116, 141, 153, 173, 182, 183, 200
See application file for complete search history.

(56) References Cited

U.S. PATENT DOCUMENTS

| | | | |
|---|---|---|---|
| 4,156,135 A * | 5/1979 | Miller et al. ............. 398/204 |
| 4,759,081 A * | 7/1988 | Witters ................... 398/202 |
| 5,029,306 A * | 7/1991 | Bull et al. ............... 342/368 |
| 5,307,073 A | 4/1994 | Riza | |
| 5,379,309 A | 1/1995 | Logan, Jr. | |
| 5,703,974 A * | 12/1997 | Sasaki et al. .............. 385/14 |
| 5,710,651 A * | 1/1998 | Logan, Jr. ............... 398/168 |
| 5,998,781 A * | 12/1999 | Vawter et al. ......... 250/227.11 |
| 6,175,672 B1 | 1/2001 | Newberg | |
| 6,211,996 B1 | 4/2001 | Fuse | |
| 6,348,683 B1 * | 2/2002 | Verghese et al. ........ 250/214.1 |

FOREIGN PATENT DOCUMENTS

DE    197 10 033    4/1998

* cited by examiner

*Primary Examiner*—Ken N Vanderpuye
*Assistant Examiner*—Daniel G Dobson
(74) *Attorney, Agent, or Firm*—Banner & Witcoff, Ltd.

(57) ABSTRACT

An integrated device transmits and/or receives information by means of millimetric waves (wavelength 1 mm-10 mm), frequencies of 30 to 300 Ghz. The device has an optoelectronic integrated circuit that interfaces with an antenna able to transmit and/or receive millimeter wave signals. The device forms a transceiver module to be used in a wireless or mobile radio local area network. The transmitter circuit is constituted by a laser in passive mode-locking. The receiver circuit is constituted by an antenna, a photodiode, and a laser identical to that of the transmitter. The photodiode, by means of appropriate bias, performs a dual function of optical and electrical mixer. In particular, the first function converts to electrical frequency the optical beat signal between two modes generated by the laser, the second function allows the received signal to be brought back to base band, thereby allowing the extraction of the modulating signal from the weak signal received through the antenna.

26 Claims, 4 Drawing Sheets

MILLIMETER WAVE TRANSMITTER USING OPTICAL HETERODYNING

CROSS REFERENCE TO RELATED APPLICATIONS

This application is the U.S. national phase of PCT application PCT/IT2002/000414, filed 21 Jun. 2002, published 31 Dec. 2003 as WO 2004/001955, and claiming the priority of PCT patent application PCT/IT2002/000414 itself filed 21 Jun. 2002.

TECHNICAL FIELD

The present invention relates to a device for information transmission and/or reception by means of millimeter waves, i.e. electromagnetic waves corresponding to frequencies of 30 to 300 GHz.

In particular, the present invention relates to a device constituted by an opto-electronic circuit and the corresponding module that uses the device.

BACKGROUND ART

Devices able to generate millimeter waves are known in the art.

For instance, negative resistance devices such as Gunn diodes and Trapatt and Impatt devices are known.

In such devices, as the usage frequency increases, the generated electromagnetic signal has progressively decreasing power and progressively broadened frequency band or emission line, so that such devices are unusable for millimeter waves corresponding to frequencies equal to or greater than 60 GHz.

Also known in the prior art are devices able to transmit millimeter waves that do not suffer from the aforementioned problem.

For instance, U.S. Pat. No. 5,998,781 discloses an opto-electronic integrated circuit or OEIC for generating and transmitting millimeter waves, comprising a ring laser circuit able to generate optical pulses and a photo-diode able to convert the optical pulses into electromagnetic waves whose frequency corresponds to millimeter waves.

The known OEIC device, however, is only an oscillator device and therefore it cannot be used to transmit information.

In particular, the known device cannot modulate the optical carrier with information constituted, for instance, by voice and/or data, and transmit the corresponding modulated electromagnetic signal.

Moreover, the aforementioned patent does not provide any indication for making OEIC devices able to receive the modulated electromagnetic signal and to extract, by demodulation, the information contained therein.

DISCLOSURE OF THE INVENTION

An aim of the present invention is to obtain a device able to transmit and/or receive modulated electromagnetic signals in the frequency range of 30 to 300 GHz without encountering the typical problems of Gunn diodes or of equivalent devices.

An aim of the present invention is also to obtain an integrated OEIC device able both to transmit and to receive electromagnetic signals modulated on millimeter waves.

The aims are achieved by the device for transmitting and/or receiving information by means of millimeter waves as claimed.

In particular, according to a first characteristic of the present invention, the OEIC device according to the invention comprises means able to modulate and demodulate respectively signals transmitted and received on carriers at high frequency (30-300 GHz).

According to another characteristic of the present invention, the millimeter wave transmission and reception functions are integrated in a single transceiver device.

BRIEF DESCRIPTION OF DRAWINGS

This and other characteristics of the present invention shall become more readily apparent from the following description of a preferred embodiment, provided purely by way of non limiting example with the aid of the accompanying drawings, in which.

In the figure, as shall be readily apparent to a person versed in the art, identical numerical reference correspond to equivalent devices, circuits or functions.

BEST MODE FOR CARRYING OUT THE INVENTION

Figure 1:
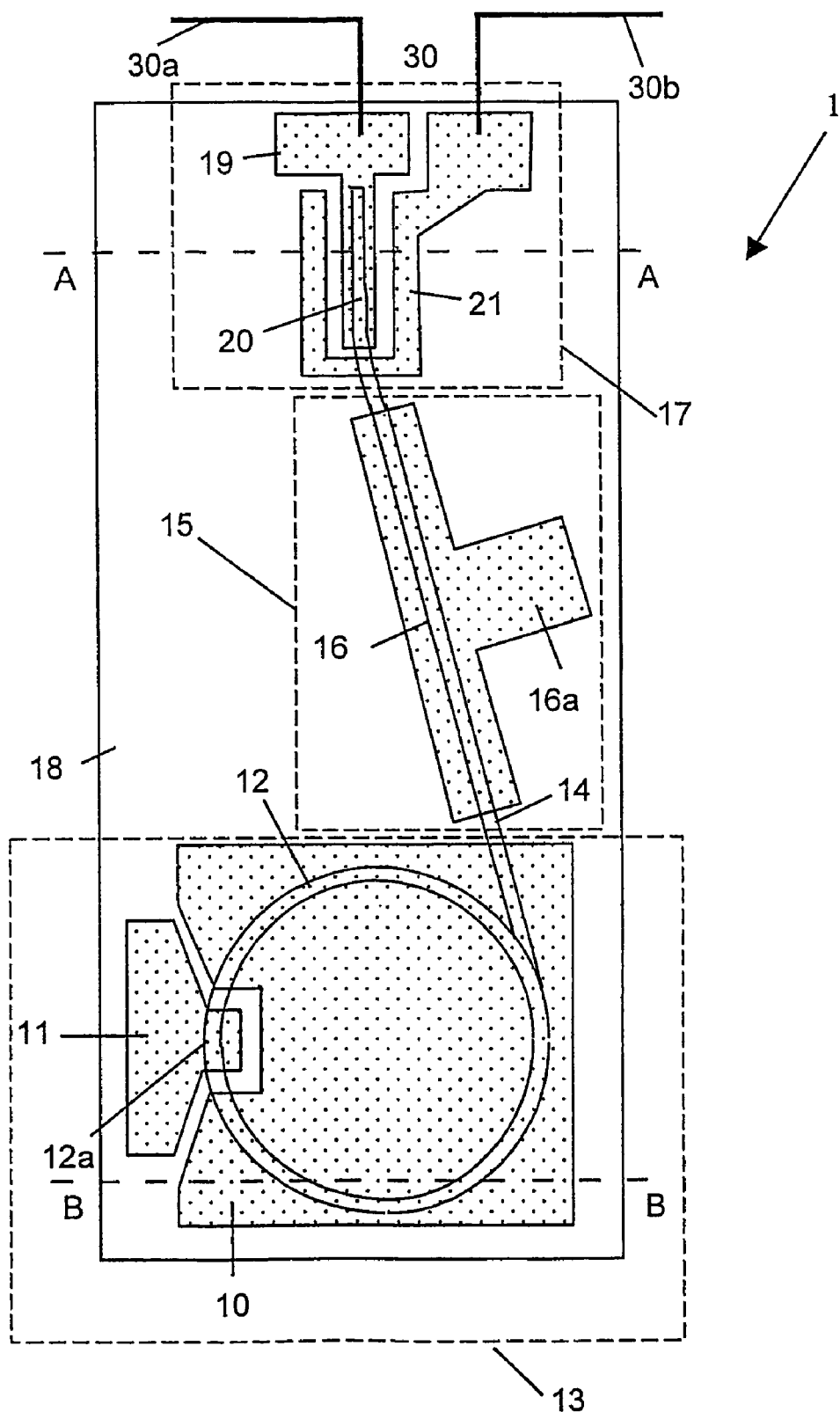
FIG. 1 shows an integrated device for transmitting information by means of millimeter waves, according to the invention.
Figure 1A:
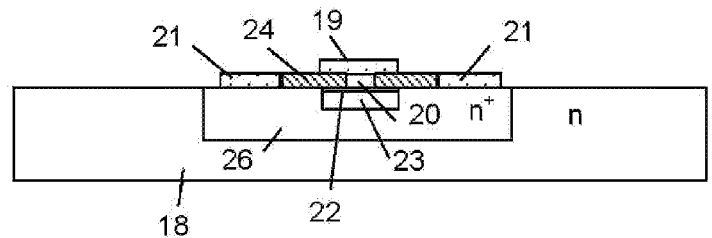
FIG. 1a shows a section of the device of FIG. 1 according to a plane A-A.
Figure 1B:
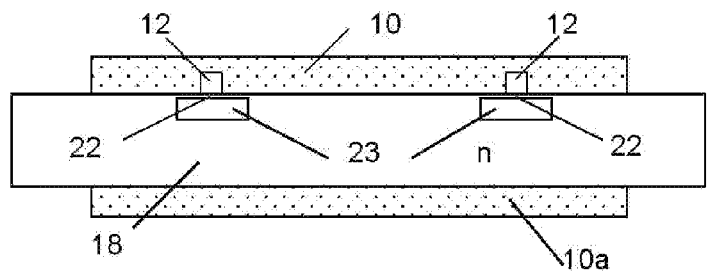
FIG. 1b shows a section of the device of FIG. 1 according to a plane B-B.

With reference to FIG. 1, the transmitter device according to the invention (transmitter) 1 comprises a known antenna 30, and an integrated circuit having a substrate 18 (FIG. 1, FIG. 1a, FIG. 1b), preferably made of semiconductor material, for instance Gallium Arsenide (GaAs) or Indium Phosphide (InP) whereon are obtained, by known techniques of growing epitaxial layers, a laser circuit or element (laser) 13 incorporating a saturable absorber 12a, an amplifier circuit or modulating element 15 and a photodiode circuit or element (photodiode) 17, as shall be described in detail hereafter.

For instance, the substrate 18 (FIG. 1, FIG. 1a, FIG. 1b) is constituted by GaAlAs—GaAs—GaAlAs or InP—InGaAsP—InP composition material which, appropriately doped, are able to allow the realisation of p or n layers and p-n or n-p junctions in order to obtain the elementary circuits according to the invention.

In particular, starting from the n substrate 18, active p guides 20 and 23 are created, able to constitute, in known fashion, optical guides.

Between the active guides 20 and 23 are obtained, in known fashion, one or more quantum wells 22 able to improve the performance of the active guides 20 and 23, increasing the photo-emission efficiency.

For example, the guide 20 is shaped as a channel or rib in order to act as a wave guide.

The structure of the integrated circuit is completed with contacts 19 and 21 for the photodiode 17, contacts 16a and 10a for the amplifier 15, contacts 10 and 10a for the laser 13 and contacts 11 and 10a for the saturable absorber 12a; in particular, the contact 10a is in common with the laser 13 and the amplifier 15.

The laser 13, for example of the ring type, as shown in FIG. 1 or, alternatively, of the linear type, for instance Fabry-Perot (FP) or Distributed Bragg Reflector (DBR), is obtained, in known fashion, in the substrate 18 and it is able to generate and transmit optical signals (optical carrier).

According to a preferred embodiment, the laser 13 comprises a guide (laser guide) 12, a first contact 10 able to constitute the anode of the laser 13, a second contact 10a able to constitute the cathode of the laser and situated under the substrate 18 (FIG. 1b), a saturable absorption area 12a, of a known type, having an associated contact 11, separate from the first contact 10 in order to assure that the laser 13 operates in passive mode-locking, as is readily apparent for a person versed in the art.

The laser 13 is coupled, in known fashion, to a wave guide 14, whose geometry is identical to that of the laser guide 12 and able to serve the function as output coupler, i.e. to extract part of the power from the laser 13.

The amplifier circuit 15, characteristic element of the present invention, is associated to a part of the wave guide 14, and comprises an amplification section 16, the contact 16a and the contact 10a, in common with the laser 13, able to bias the amplifier and to insert the modulation signal.

The amplifier circuit 15, thus obtained, is able to serve the function of modulator: applying between the contact 16a and the contact 10a (modulation elements) a current $I_e$ proportional to a modulation signal, for example a modulating signal in a frequency range around 100 MHz, it is possible to vary in corresponding fashion the optical signals generated by the laser 13.

In particular the current $I_e$, if positive, is able, for example, to allow the passage of the optical signals and, if negative, is able to prevent their passage.

Therefore, by adjusting the intensity of the current $I_e$, according to useful information to be transmitted, it is possible to modulate in amplitude the optical carrier generated by the laser 13.

The modulating signal can be both analogue and digital, without thereby departing from the characteristics of the present invention.

The photo-diode 17 (FIG. 1a), of a known kind, comprises the contacts 19 and 21, able to constitute respectively the anode and the cathode of the photodiode. They are insulated from each other through a layer of insulating material 24 and are connected to respective terminals 30a and 30b of the antenna 30. In the photodiode 17 the guides 20 and 23 are separated from the substrate 18 by means of a diffusion area 26 of the $n^+$ type able to lower the series resistance of the photodiode. The photodiode 17 is able to convert the modulated signal into electromagnetic signals whose frequency corresponds to the millimeter waves.

The photodiode 27 is able, as is well known, to convert the optical modes generated by the laser 13 into millimeter waves at a frequency of c/np in which c is the speed of light, n is an indicative parameter of the index of refraction of the optical guide and p is the perimeter (in this case of the ring laser) or twice the length (in the case of linear FP or DBR laser) of the laser 13.

The antenna 30, of a known type, is able to transmit, by means of the terminals 30a and 30b, the millimeter electromagnetic waves generated by photo-diode 17.

In accordance with a second embodiment, the device constitutes a receiver device (receiver) 2 (FIG. 2) and comprises an antenna 40, a laser circuit 13, whose shape and characteristics are equivalent to those described for the transmitter 1 (FIG. 1, FIG. 2) and a photodiode circuit (photodiode) 27, connected to the laser 13 by means of a wave guide 20.

The antenna 40, of a known type, has two terminals 40a and 40b equivalent to those described for the transmitter 1, and is able to receive modulated millimeter waves transmitted, for instance, by the transmitter 1.

Figure 2:
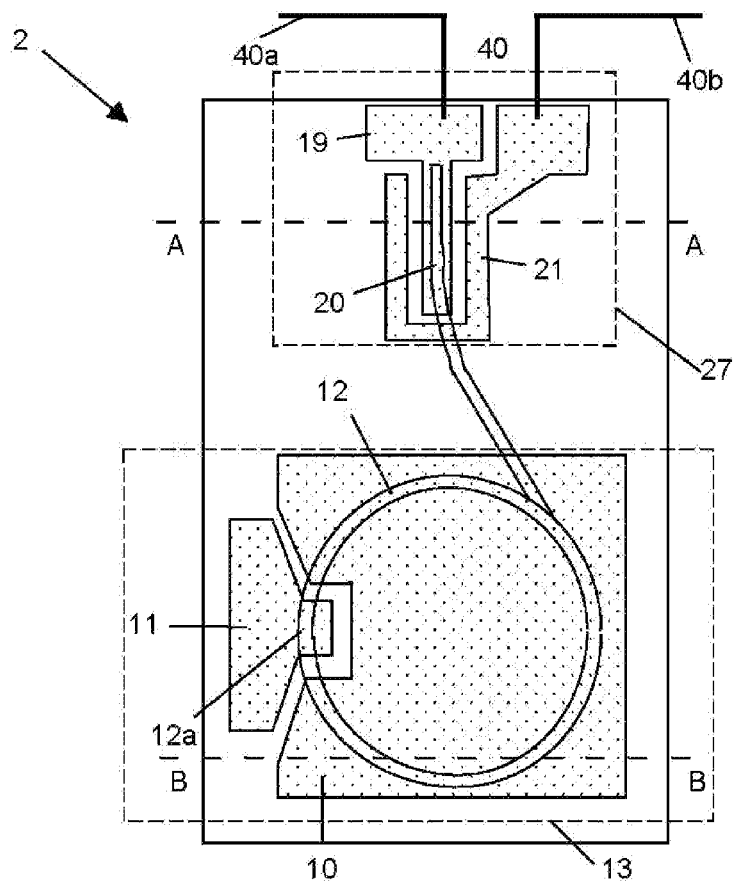
FIG. 2 shows the integrated device for receiving information by means of millimeter waves.

Between the laser 13 and the photodiode 27 is interposed, in a preferred embodiment not shown in FIG. 2, an amplifier in case the power emitted by the laser is not sufficient to bring the photodiode to work in non-linearity area. In this case, between the contacts of the amplifier a continuous bias is applied.

The laser 13 is able to generated, in known fashion, longitudinal optical modes, for instance two optical modes, respectively E1 and E2, and to transmit them, by means of the guide 20, to the photodiode 27. In the photodiode 27, the two optical modes are subject to optical beat generating an electrical signal at the desired frequency (30-300 GHz).

The photodiode (receiving signal) 27 comprises an anode 19 and a cathode 21 connected to the antenna terminals 40a and 40b and equivalent to those described for the photodiode 17, but it is associated, according to a characteristic of the present invention, through the anode 19 and the cathode 21 to a biasing system or bias elements able to make the photodiode itself 27 operate both as a photodiode and as a diode, as will be described in detail hereafter, in such a way as to reveal or detect information corresponding to the modulation component of the received signal and allow to receive and process useful information transmitted by means of millimeter waves.

This effect is readily apparent from the mathematical expressions indicated hereafter, verified experimentally, which clearly demonstrated that that modulation component of the received signal can be reconstructed on the basis of the signals collected and transmitted by the anode 19 and by the cathode 21 (detecting elements) of the photodiode 27 to a signal processing circuit as described in detail hereafter.

The photodiode 27 is able, as is well known, to convert the optical modes generated by the laser 13 into millimeter waves at a frequency of c/np in which c is the speed of light, n is an indicative parameter of the index of refraction of the optical guide and p is the perimeter (in the case of ring laser) or twice the length (in the case of linear laser FP or DBR) of the laser 13.

In the embodiment described below, for the sake of simplicity, only two optical modes are considered, although the optical modes generated by the laser 13 can be more than two. In this second case, however, the example can always be brought back to the two optical modes alone, as is readily apparent to the person versed in the art.

Moreover, for the sake of greater clarity, in the following expression the modulating signal is not shown.

As is well known, the two optical modes can be represented mathematically by means of the following expressions:

$$E_1 = E_{10} \exp i2\pi f_1 t + \theta_1 \quad (1)$$

$$E_2 = E_{20} \exp i2\pi f_2 t + \theta_2 \quad (2)$$

in which $E_{10}$ and $E_{20}$ are the amplitudes of the optical modes generated by the laser 13, $f_1$ and $f_2$ are the frequencies of the waves, $[f_1-f_2=c/np,]$ and $\theta_1$ and $\theta_2$ are the optical phases of the optical modes or ranges.

The photodiode 27 is able to generated, for two optical modes, a photo-current equal to:

$$I_{ph} = \langle |E_1+E_2|^2 \rangle, \quad (3)$$

in which the bars conventionally indicate the module, and the parentheses $\langle \ldots \rangle$ indicate the time average, so that, by simple replacement, one obtains:

$$I_{ph} = E_{10}^2 + E_{20}^2 + 2E_{10}E_{20}\cos 2\pi(f_2-f_1)t + \theta_2 - \theta_1 = \quad (4)$$
$$I_{ph0}\cos 2\pi(f_2-f_1)t + \theta_2 - \theta_1$$

As will be readily apparent to a person versed in the art, the first two terms of the expression (4) represent continuous components, the third shows a beat signal at a frequency of $f_1-f_2=c/np$.

In the case of the signals received by the antenna 40, said signals can be represented as $$e_{mm} = e_0 \cos 2\pi f_{mm} t \quad (5)$$

Said signals are able to generate in the photodiode 27 a current equal to:

$$i_{mm} = [e_0/(Z_A+Z_{ph})] \cos 2\pi f_{mm} t \quad (6)$$

in which $Z_A$ and $Z_{ph}$ are the impedance of the antenna and the dynamic impedance of the photodiode.

Since the voltage-current characteristic of the photo-diode is not linear, the superposition of the photo-generated current $I_{ph}$ and of the current $i_{mm}$ received from the antenna 40 gives rise to an electrical beat.

Representing the voltage-current characteristic of the photo-diode as:

$$I_{tot} = I_0[\exp(qV/\eta kT) - 1] - I_{ph} \quad (7)$$

in which V is the voltage applied to the photodiode, $I_0$ is the inverse current, q is the charge of the electron, $\eta$ is the ideality of the junction, kT=25 meV is the equivalent temperature energy and $I_{tot}$ is the total current through the photodiode. For $I_{tot} = i_{mm}$ one finds that the voltage V between anode and cathode 21 is:

$$V = (\eta kT/q)\{1 + \ln(I_{ph} + i_{mm})/I_0\} \quad (8)$$

said voltage, ignoring the continuous term and developing the logarithm to the second order (as log $(1+X)=1+X^2/2$) becomes:

$$V = (\eta kT/q)\{1 + (I_{ph} + i_{mm} - I_0)^2/2I_0^2\} \quad (9)$$

and replacing the expressions of $I_{ph}$ and $i_{mm}$ one obtains:

$$V = (\eta kT/q)2I_{ph0}i_{m0}\cos 2\pi(f_1 - f_2 - f_{mm})t \quad (10)$$
$$= (\eta kT/q)2I_{ph0}i_{m0}\cos 2\pi(c/np - f_{mm})t$$

Briefly, from the final expression 10 it emerges, in accordance with the present invention, that the voltage at the ends (19, 21) of the photodiode 27 contains the demodulated component of the received signal.

Figure 4:
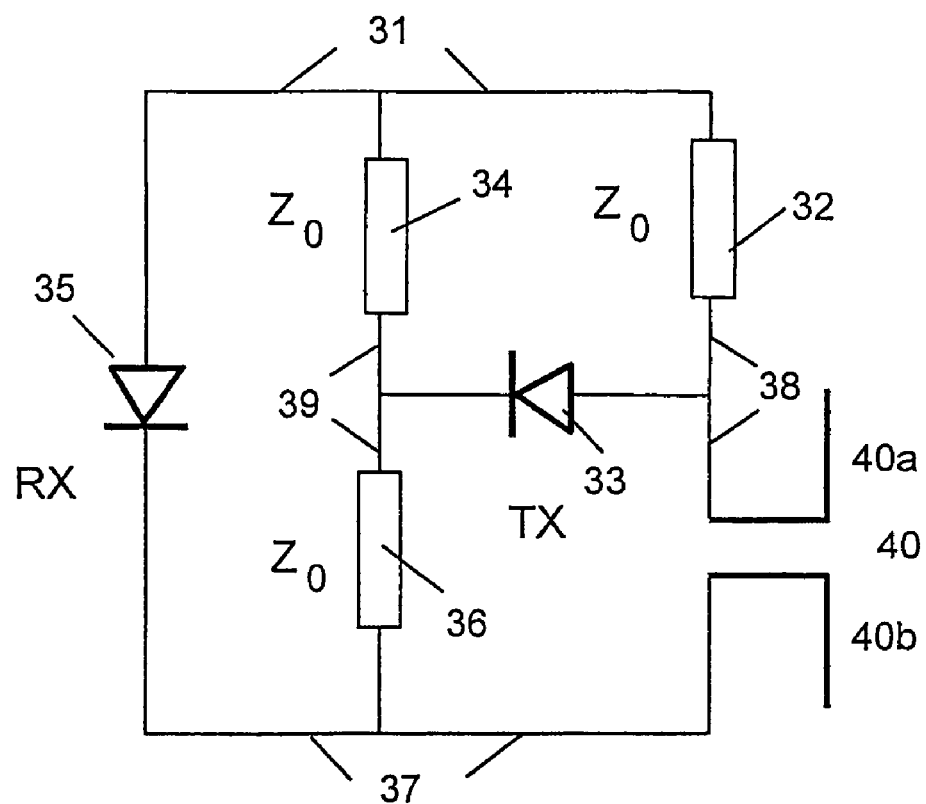
FIG. 4 shows an electrical diagram of a part of the transmission and reception device of FIG. 3.

In other words, thanks to the non linearity of the characteristic of the photodiode 27 it is possible to extract from the contacts 19 and 21 (detecting elements) a voltage that, appropriately processed by means of an electronic circuit 70 (FIG. 4) associated, for instance, to the contacts of the receiver 2 (FIG. 2), allows to reconstruct or demodulate the modulation component of the received signal, i.e. the useful information of the received signal.

The non linearity of the characteristic of the photodiode is maximised, for instance, appropriately selecting the working point of the photodiode by means of a bias voltage $V_{bias}$ applied thereto. In most photodiodes available from normal manufacturers, the maximum of the demodulated signal is obtained experimentally using a $V_{bias}$ of +200÷+300 mV, i.e. such as to bring the photodiode into slight direct bias.

This voltage is applied to the photodiode by means of a series resistance, in a manner that is obvious to a person versed in the art.

In accordance to a variation, readily understandable for a person versed in the art, the receiver device 2 can also be configured solely to receive non modulated millimeter waves. In this type of solution, too, the photodiode 27, biased in conditions of non linearity, is able to detect the millimeter waves received by means of the antenna terminals 40a and 40b.

Figure 3:
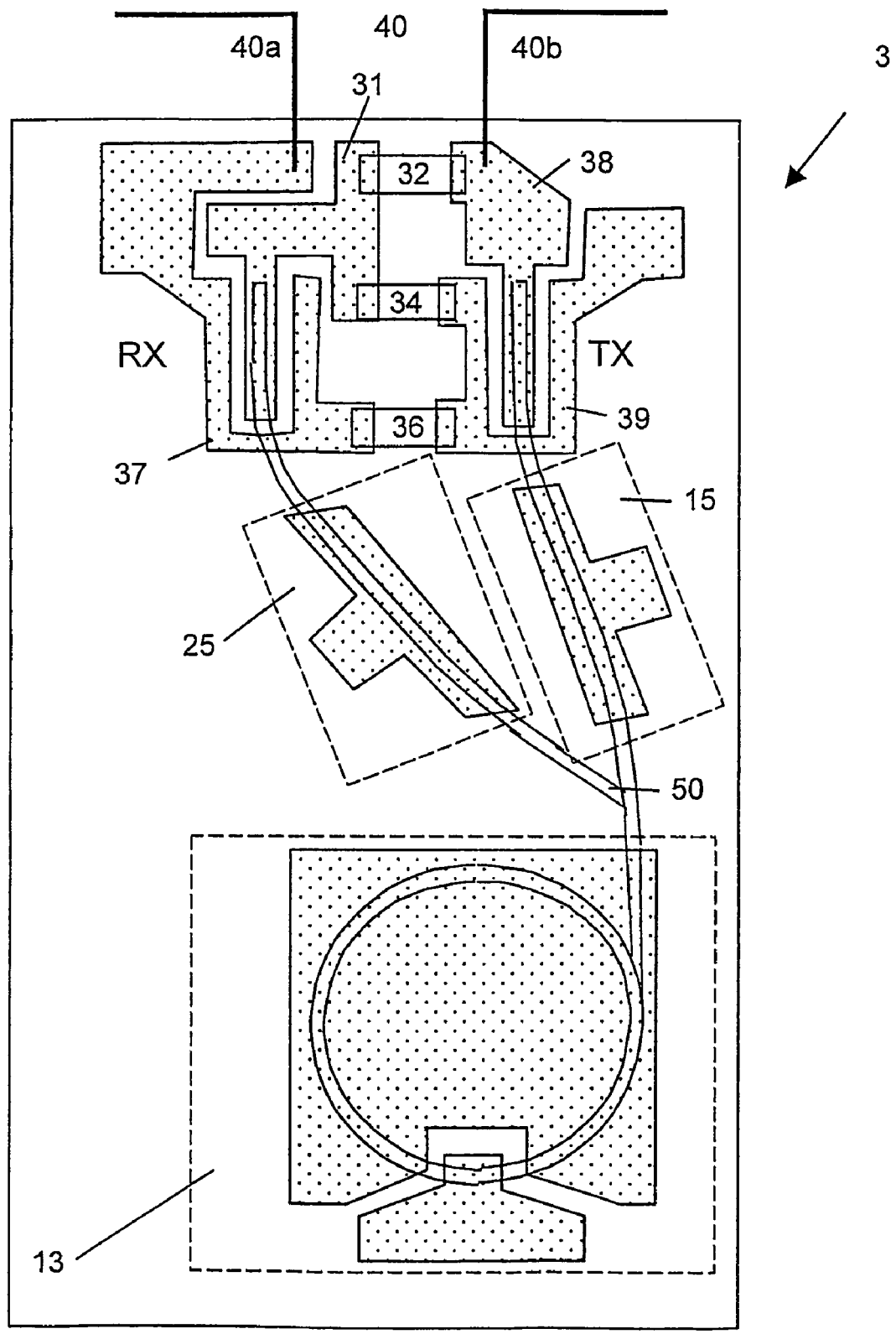
FIG. 3 shows an integrated device for transmitting and receiving information by means of millimeter waves.

According to a third embodiment, the device constitutes a transceiver device (transceiver) 3 (FIG. 3), resulting from the combination of the devices 1 and 2 (FIG. 1, FIG. 2), as described, and comprises an antenna 40, a laser 13, a first photodiode 17 connected to the antenna 40 and used to transmit the modulated signal and a second photodiode 27 connected to the same antenna and used to receive the modulated millimeter wave signal. The first photodiode 17 and the second photodiode 27 are connected to the laser 13, respectively, by means of a first amplifier circuit 15 and a second amplifier 25 and a coupler 50 that allows to insert the signal generated by the laser 13 both in the first photodiode 17 and in the second photodiode 27. In the photodiode 17, by optical beat, a photo-generated current is generated at a frequency corresponding to the selected millimeter wavelength, with superposed the modulating signal obtained by varying the gain of the amplifier 15. Said current is used as the driving current of the antenna. In the second photodiode the photo-generated at the frequency of the millimeter wave carrier is used to move to the base band the signal received through the antenna through an electrical beat obtained by means of the non linear characteristic of the photodiode made to operate simultaneously also as a mixer diode, by means of appropriate bias applied through the contacts 38 and 39 as described previously for the receiver of FIG. 2.

In order to combine the functions of the transmitter 1 with those of the receiver 2 in a single transceiver device 3, a device having a resistor bridge electrical arrangement (FIG. 4) is proposed herein as a preferred embodiment. As other embodiments, it would be possible to use couplers or circulators for millimeter waves.

In accordance with said arrangement, the first photodiode 17 (FIG. 3, FIG. 4) and the second photodiode 27 are positioned on opposite diagonals of the resistor bridge comprising respective resistors 32, 34, 36, each having characteristic impedance equal to that of the antenna 40.

Thanks to said arrangement, the photodiodes 17 and 27 are connected to the same antenna 40 (which operates both in transmission and reception), but the exchange of the signals between the first photodiode (transmission photodiode) 17 and the second photodiode (reception photodiode) 27 is nil, as will be readily apparent to a person versed in the art.

In particular, the transceiver 3 comprises, in addition to the circuit elements described above, for the transmitter 1 and the receiver 2, the resistors 32, 34, 36 in which the resistor 32 is connected between the anode of the photodiode 17 and the anode of the photodiode 27, the resistor 34 is connected between the anode of the photodiode 17 and the cathode of the photodiode 27 and the resistor 36 is connected between the cathode of the photodiode 17 and the cathode of the photodiode 28. The disposition of the resistors is optimised to reduce the distance between the contacts to be connected in order to reduce the effect of parasitic capacities.

Figure 5:
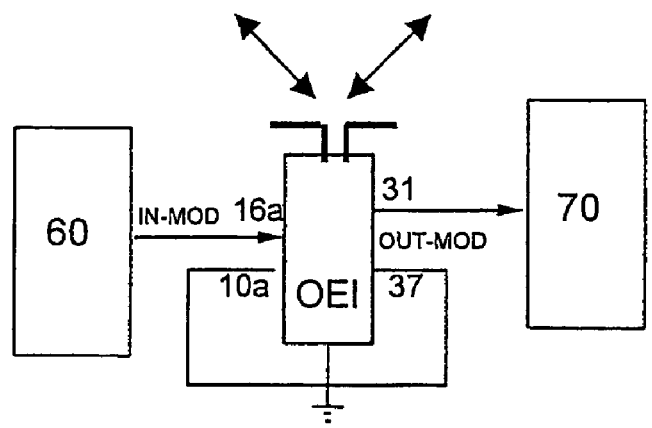
FIG. 5 shows a block diagram of a module for local area network comprising the device of FIG. 3.

The transceiver 3 is, therefore, able both to transmit and to receive useful information and, therefore, it can be used, for example, as a basic circuit element for a transceiver electronic module (module) 5 (FIG. 5) in a wireless millimeter wave local area network (local area network), as described in detail hereafter.

In this case as well, in accordance with a possible variation readily understandable to a person in the art, the transceiver device 3 can be used alternatively to transmit and receive non modulated millimeter waves, simply not applying modulation signals to the first amplifier 15 and revealing only the millimeter waves at the ends of the second photodiode 27.

For instance, the module 5 comprises a first electronic circuitry 60, of a known type, connected in input, to the contacts 16a and 10a of the amplifier 15 of the transceiver 3 and able to generate, on the basis of useful information to be transmitted, a modulating signal $I_e$ (IN-MOD) to be transmitted superposed to the millimetric carrier.

Moreover, the module 5 comprise a second electronic circuitry 70, of known fashion, connected in output, to the contacts 31 and 37 of the receiving photodiode of the transceiver 3 and able to process the output signal (OUT-MOD) implementing the function of extracting the useful information based on the expression [10]; in other words, the electronic circuitry 70 is able to reconstruct or demodulate the useful information, based on the output signal (OUT-MOD) from the transceiver 3.

Clearly, also the transmitter 1 and the receiver 2, appropriately coupled, can be used to obtain a wireless local area network, as is readily apparent to a person versed in the art.

The devices and modules according to the present invention have been described taking as a reference millimetric waves in the frequency range between 30 and 300 GHz, but nothing prevents the extension of their use both to lower frequencies, range in which said solution could be uneconomical, and to higher frequencies, range in which current technological limitations and the lack of adequate measuring instrumentation prevent a punctual certification.

Obvious modifications or variations are possible to the above description, in dimensions, shapes, materials, components, circuit elements, connections and contacts, as described in the details of the circuitry and of the illustrated construction and of the method of operation without thereby departing from the spirit of the invention as set out by the claims that follow.

The invention claimed is:

1. An apparatus, comprising:
   a laser configured to generate at an output optical signals having two different frequencies that interfere with each other to produce an optical beat;
   antenna terminals;
   a first photodiode configured to receive the optical signals from said laser, to generate a first millimeter wave signal based on the optical beat, and to receive a second millimeter wave signal from the antenna terminals; and
   a second photodiode configured to recieve the optical signals from said laser, to generate a third millimeter wave signal based on the optical beat, and to forward the third millimeter wave signal to the antenna terminals; and
   a substrate on which the laser, the first photodiode, and the second photodiode are integrated,
   wherein the first photodiode is further configured to mix the second millimeter wave signal with the first millimeter wave signal so as to generate an electrical beat between the first and second millimeter wave signals.

2. The apparatus of claim 1 wherein the substrate is made of semiconductor material.

3. The apparatus of claim 2 wherein the semiconductor material comprises gallium arsenide or indium phosphide.

4. The apparatus of claim 1 wherein the laser comprises a ring laser.

5. The apparatus of claim 4 wherein the laser is configured to operate in passive mode-locking.

6. The apparatus of claim 1, further comprising;
   a first waveguide coupling the output of the laser with the first photodiode; and
   a second waveguide the output of the laser with the second photodiode.

7. The apparatus of claim 6 wherein the second waveguide has a first amplifier.

8. The apparatus of claim 7 wherein the first waveguide has a second amplifier.

9. The apparatus of claim 7 wherein the laser comprises a coupler configured to couple the laser to the first waveguide and to the second waveguide.

10. The apparatus of claim 1, further comprising an electronic circuit coupled to the first photodiode and configured to detect the electrical beat.

11. The apparatus of claim 7, further comprising:
    a first electronic circuit coupled with the first amplifier and configured to generate a modulating signal to be superposed on the optical signals transmitted through the second waveguide.

12. The apparatus of claim 10, further comprising a bias element configured to apply a bias voltage to the first photodiode.

13. The apparatus of claim 11, further comprising a bias element configured to apply a bias voltage to the first photodiode.

14. The apparatus of claim 11 wherein the modulating signal is an analog signal.

15. The apparatus of claim 11 wherein the modulating signal is a digital signal.

16. The apparatus of claim 1, further comprising:
    a first resistor coupled between a first terminal of the first photodiode and a first terminal of the second photodiode;

a second resistor coupled between the first terminal of the first photodiode and a second terminal of the second photodiode; and a third resistor coupled between a second terminal of the first photodiode and the second terminal of the second photodiode.

17. The apparatus of claim 16, wherein the first terminal of the first photodiode is an anode, the first terminal of the second photodiode is an anode, the second terminal of the first photodiode is a cathode, and the second terminal of the second photodiode is a cathode.

18. The apparatus of claim 1, further comprising:
a first resistor coupled between first photodiode and a first one of the antenna terminals;
a second resistor coupled between the first photodiode and the second photodiode; and
a third resistor coupled between the second photodiode and a second one of the antenna terminals.

19. The apparatus of claim 18, wherein the first photodiode is coupled between the first one of the antenna terminals and a circuit node that is between the second and third resistors, and the second photodiode is coupled between the second one of the antenna terminals and a circuit node that is between the first and second resistors.

20. The apparatus of claim 18, wherein the antenna terminals are coupled between the first and second photodiodes.

21. An apparatus, comprising:
a laser configured to generate an optical signal with an optical beat;
an antenna connection;
a first photodiode configured to receive the optical signal from said laser and to generate a first millimeter wave signal based on the optical beat, and to receive a second millimeter wave signal from the antenna connection; and
a second photodiode configured to receive the optical signal from said laser, to generate a third millimeter wave signal based on the optical beat, and to send the third millimeter wave signal to the antenna connection,
wherein the first photodiode is further configured to mix the second millimeter wave signal with the first millimeter wave signal so as to generate an electrical beat between the first and second millimeter wave signals.

22. The apparatus of claim 21, further comprising:
a first resistor coupled between a first terminal of the first photodiode and a first terminal of the second photodiode;
a second resistor coupled between the first terminal of the first photodiode and a second terminal of the second photodiode; and
a third resistor coupled between a second terminal of the first photodiode and the second terminal of the second photodiode.

23. The apparatus of claim 22, wherein the first terminal of the first photodiode is an anode, the first terminal of the second photodiode is an anode, the second terminal of the first photodiode is a cathode, and the second terminal of the second photodiode is a cathode.

24. The apparatus of claim 21, further comprising:
a first resistor coupled between first photodiode and the antenna connection;
a second resistor coupled between the first photodiode and the second photodiode; and
a third resistor coupled between the second photodiode and the antenna connection.

25. The apparatus of claim 24, wherein the first photodiode is coupled between the antenna connection and a circuit node that is between the second and third resistors, and the second photodiode is coupled between the antenna connection and a circuit node that is between the first and second resistors.

26. The apparatus of claim 24, wherein the antenna connection is coupled between the first and second photodiodes.

* * * * *